United States Patent [19]
Murata et al.

[11] Patent Number: 6,019,563
[45] Date of Patent: Feb. 1, 2000

[54] AUTOMATED GUIDED VEHICLE

[75] Inventors: Masanao Murata; Tatsuo Tsubaki; Hitoshi Kawano, all of Ise, Japan

[73] Assignee: Shinko Electric Co., Ltd., Tokyo, Japan

[21] Appl. No.: 09/059,361

[22] Filed: Apr. 14, 1998

[30]     Foreign Application Priority Data

Apr. 14, 1997 [JP] Japan ........................................ 9-96153
Jul. 8, 1997 [JP] Japan ...................................... 9-182872

[51] Int. Cl.⁷ ...................................................... B25J 19/00
[52] U.S. Cl. ........................ 414/222.01; 414/940; 901/49
[58] Field of Search ................................... 414/222, 396, 414/401, 539, 940; 901/1, 49

[56]              References Cited

U.S. PATENT DOCUMENTS

| 4,652,205 | 3/1987 | Ross et al. ................................. 414/49 |
| 4,941,103 | 7/1990 | Kato ........................................... 414/49 |
| 5,428,279 | 6/1995 | Sugimoto et al. .......................... 414/49 |

FOREIGN PATENT DOCUMENTS

| 2643987 | 9/1990 | France ...................... 414/49 |
| 311296 | 12/1990 | Japan ...................... 414/49 |
| 4008495 | 1/1992 | Japan ...................... 414/49 |

*Primary Examiner*—Christopher P. Ellis
*Assistant Examiner*—Gregory A. Morse
*Attorney, Agent, or Firm*—Bacon & Thomas, PLLC

[57]            ABSTRACT

An automated guided vehicle includes a transporting portion having an upper surface and a driving device, the transporting portion being movable by the driving device; a transferring device provided on the upper surface of the transporting portion, the transferring device being capable of transferring a workpiece to or from an apparatus; and a mounting portion formed on the upper surface of the transporting portion, the mounting portion having at least two opening portions which allow an operation for transferring the workpiece. In the automated guided vehicle, photosensors are respectively arranged on the opening portions to detect an object which intrudes into a predetermined area or projects from the predetermined area, and a control device monitors a state of the photosensors and controls the transferring device or the driving device in accordance with the state of the photosensors.

13 Claims, 12 Drawing Sheets

AUTOMATED GUIDED VEHICLE

BACKGROUND OF THE INVENTION

1. Field of the Invention

This invention relates to an automated guided vehicle having an arm and a manipulator so as to transport and transfer a workpiece.

2. Background

In recent years, cassettes storing, for example, semiconductor wafers, are frequently transferred by an Automated Guided Vehicle (hereinafter referred to as an AGV) in a clean room for manufacturing semiconductor devices or FPDs (Flat Panel Displays) exemplified by LCDs (Liquid Crystal Displays).

At the present time, machines such as robots and human frequently and simultaneously perform operations at the same place in facilities for manufacturing semiconductor devices.

If AGVs for transporting wafer cassettes and human perform operations to be intermingled with each other, an issue of securing safety is raised due to the enlargement of size and weight of the wafer.

To improve safety of the AGV having manipulators for transferring wafer cassettes, for example, a protective fence, which is formed between the manipulator and the human, has been proposed.

FIG. 6 is a perspective view showing an example of the structure of a conventional AGV 100. Referring to FIG. 6, reference numeral 101 represents a vehicle portion having a control unit and wheels (not shown) and capable of moving in directions indicated with arrows A and A'.

A plurality of wafer cassette 102 can be mounted on an upper surface 101a of the vehicle portion 101. Moreover, an articulated manipulator 103 is mounted on the upper surface 101a.

Moreover, protective fences 104 are disposed on the upper surface 101a of the vehicle 101 to be located on end portions 101b-2 to 101b-4 except for an end portion 101b-1.

FIG. 7 is a perspective view showing the schematic structure of a clean room in which the AGV 100 shown in FIG. 6 are operated.

As shown in FIG. 7, a plurality of apparatuses 110-1, 110-2, . . . , (hereinafter expressed as 110-n if necessary) are disposed in the clean room.

The apparatuses 110-n each has a mounting portion 111. The wafer cassettes 102 are mounted on a specific surface of the mounting portion 111. However, the element 102 is not limited to the wafer cassette and, therefore, it may be a semiconductor wafer or a box in which the semiconductor wafers are stored.

In the foregoing clean room, the AGV 100 moves along surfaces of the apparatuses 110-n having the mounting portions 111. The apparatuses are usually disposed on opposite sides of the movement passage. The AGV cannot always move on the same side of the apparatuses.

However, the manipulator 103 is able to perform the transferring operation at only end portion 101b-1 of the upper surface 101a of the AGV 100 at which the protective fence 104 is not provided. Therefore, the end portion 101b-1 of the upper surface 101a of the AGV 100 needs to always face each apparatus 110-n.

Therefore, there is a case that the AGV 100 needs to perform a spin turn as indicated by B-2 at position B in FIG. 7. Since the movement of the AGV 100 must temporarily be interrupted when the spin turn is performed, the transferring operation speed cannot be raised.

In general, there is a case that semiconductor wafers are handled in a small clean room. However, since the above-mentioned operation of the AGV 100 requires a large space for the movement thereof, it may cause an excessive waste of time.

Another conventional art will now be described with reference to FIGS. 10 to 11.

FIG. 10 is a perspective view showing a state in a clean room of OHT (Overhead Hoist Transportation) type with which wafers are suspended from upper position. Such clean room has been recently employed.

Since semiconductor wafers, which are manufactured in a clean room, have been enlarged in recent years, a method called "ME" (Mini-Environment) with which wafers are stored in each box has been employed. Since wafers are stored in boxes provided for the AGV, contamination with dust can be prevented. In view of transportation of wafer cassette under such ME, the clean room of OHT type in which wafers are suspended from the ceiling has been employed in order to effectively use the space of the clean room.

As shown in FIG. 10, the clean room of the OHT type differs from the clean room shown in FIG. 7, and requires an opened space above the position of each apparatus 420 at which the wafer cassette is mounted.

It leads to a fact that each apparatus 420 or a stocker 420a having a load port 421 forwardly projecting is usually employed.

FIG. 11 is a perspective view showing the relationship between the apparatuses 420 from which the load ports 421 are projected and an AGV 400a in a case where the OHT type structure is employed.

According to the structure as shown in FIG. 11, since the load ports 421 project over the front surfaces of the apparatuses 420, spaces are created between a certain load port 421 and an adjacent load port 421.

Since a human may exist in the above-mentioned space as shown in FIG. 11, there is a possibility that the arm 403 and the human being come in contact with each other during the transferring operation. Therefore, in view of the case as shown in FIG. 11, even if a protective fence is provided on the AGV, a defense device is required between each apparatus and the AGV for safety.

SUMMARY OF THE INVENTION

In view of the foregoing, an object of the present invention is to provide an AGV is capable of safely, certainly and quickly performing the transferring operation while repeating movements and securing safety even if human and AGVs exist mixedly.

According to the first aspect of the present invention, there is provided an automated guided vehicle which includes: a transporting portion having an upper surface and a driving device, the transporting portion being movable by the driving device; a transferring device provided on the upper surface of the transporting portion, the transferring device being capable of transferring a workpiece to or from an apparatus; a mounting portion formed on the upper surface of the transporting portion, the mounting portion having at least two opening portions which allow an operation for transferring the workpiece; at least one photosensor respectively arranged on each of the opening portions to detect an object which intrudes from outside of the mounting portion into the mounting portion or projects from the mounting portion to the outside; and a control device which monitors a state of the photosensors and controls one of the transferring device and the driving device in accordance with the state of the photosensors.

According to the second aspect of the present invention, the photosensors each include a light emitting device emitting a beam and a light receiving device receiving the beam, the light emitting device and the light receiving device being respectively disposed on opposite end portions of each of the opening portions so as to oppose to each other, wherein when a beam emitted by the light emitting device of one of the opening portions and being incident upon the corresponding the light receiving device is obstructed, the control device judges intrusion or projection of an object.

According to the third aspect of the present invention, the control device controls the transferring device into a non-operative state when one of the photosensors, which is arranged on one of the opening portions other than the opening portion through which the transferring operation is performed, has detected intrusion or projection of an object.

According to the fourth aspect of the present invention, the control device controls the photosensor arranged on the opening portion through which the transferring operation is performed into a non-operative state, wherein when the other of the photosensors in an operative state detects intrusion or projection of an object, the control device controls the transferring device into a non-operative state.

According to the fifth aspect of the present invention, the photosensors each include a plurality of light emitting devices emitting a beam and a plurality of light receiving devices receiving the beam, the light emitting devices and the light receiving devices being respectively disposed on opposite end portions of each of the opening portions so as to oppose to each other, the automated guided vehicle in which when a beam emitted by one of the light emitting devices and being incident upon the corresponding one of the light receiving devices is obstructed, intrusion or projection of an object is detected.

According to the sixth aspect of the present invention, the photosensors each include a sensor portion having a light emitting device emitting a beam and a light receiving device receiving the beam, and a reflecting portion reflecting the beam emitted by the light emitting device so that the beam is incident upon the light receiving device, the sensor portion and the reflecting portion being respectively disposed on opposite end portions of each of the opening portions, wherein the control device judges intrusion or projection of an object when a beam emitted by the light emitting device and reflected by the reflecting portion is obstructed.

According to the seventh aspect of the present invention, the reflecting portion has reflecting devices, and wherein the beam emitted by the light emitting device is reflected between the reflecting devices and is incident upon the light receiving device.

According to the eighth aspect of the present invention, the sensor portion has a reflecting device, and the beam emitted by the light emitting device is repeatedly reflected between the sensor portion and the reflecting portion and is incident upon the light receiving device.

Furthermore, according to the ninth aspect of the present invention, there is provided an automated guided vehicle which includes: a transporting portion having an upper surface and a driving device, the transporting portion being movable by the driving device; a transferring device provided on the upper surface of the transporting portion, the transferring device being capable of transferring a workpiece to or from an apparatus; a mounting portion formed on the upper surface of the transporting portion, the mounting portion having at least two opening portions which allow an operation for transferring the workpiece; at least two photosensors, each photosensor being attached to a position in an opening plane of one of the opening portions, each of the photosensors including a light scanning device emitting a beam and scanning the opening plane with the beam; and a control device which monitors a state of the photosensors and controls one of the transferring device and the driving device in accordance with the state of the photosensors, wherein the control device detects intrusion of an object, when a distance of propagation of the beam emitted from the photosensor at a certain scanning angle, reflected in the opening plane and incident upon the light scanning device, becomes shorter than a distance which is previously determined to correspond to that scanning angle.

As described above, according to the above aspects of the present invention, the automated guided vehicle is able to safely and quickly performing the transferring operation while repeating movements.

Furthermore, according to the tenth aspect of the present invention, there is provided an automated guided vehicle which includes: a transporting portion having an upper surface and a driving device, the transporting portion being movable by the driving device; a transferring device provided on the upper surface of the transporting portion, the transferring device being capable of transferring a workpiece to or from an opening portion of an apparatus; a mounting portion formed on the upper surface of the transporting portion, the mounting portion having at least two opening portions which allow an operation for transferring the workpiece; a light emitting portion emitting a beam, the light emitting portion being provided on one of the opening portion of the apparatus and each of the opening portions of the mounting portion; and a light receiving portion receiving the beam, the light receiving portion being provided on the other of the opening portion of the apparatus and each of the opening portions of the mounting portion, wherein an operation of the transferring device is interrupted when the beam is obstructed.

According to the eleventh aspect of the present invention, the light emitting portion is provided on an end portion of the opening portion of the apparatus, and the light receiving portion is provided on an end portion of each of the opening portions of the mounting portion, so that a light curtain is formed between the opening portion of the apparatus and one of the opening portions.

According to the twelfth aspect of the present invention, the light receiving portion is provided on an end portion of the opening portion of the apparatus, and the light emitting portion is provided on an end portion of each of the opening portions of the mounting portion, so that a light curtain is formed between the opening portion of the apparatus and one of the opening portions.

As described above, according to the above aspects of the present invention, even if a space is formed between the apparatus and the automated guided vehicle, the transferring region between the apparatus and the automated guided vehicle can be monitored by dint of the light curtain. Consequently, significant safety can be secured.

The present invention is not limited to the automated guided vehicles which are described above. For example, the present invention may apply to a rail guided vehicle (RGV) instead of each of the automated guided vehicles. Therefore, such rail guided vehicle may have a transporting portion including an upper surface, a driving device and a portion contacting with a rail which is provided in a clean room, and being movable along the rail by the driving device, instead of each of the transporting portions described above.

BRIEF DESCRIPTION OF THE DRAWINGS

FIG. 5 is a side view showing another example of the sensor according to the present invention for detecting intrusion of a worker or the like;

FIG. 11 is a perspective view showing the detailed relationship realized by the conventional technique between the apparatus 420 from which the load ports 421 are projected as the OHT-type structure and AGVs 400a.

DETAILED DESCRIPTION OF THE PREFERRED EMBODIMENTS

First Embodiment

Figure 6:
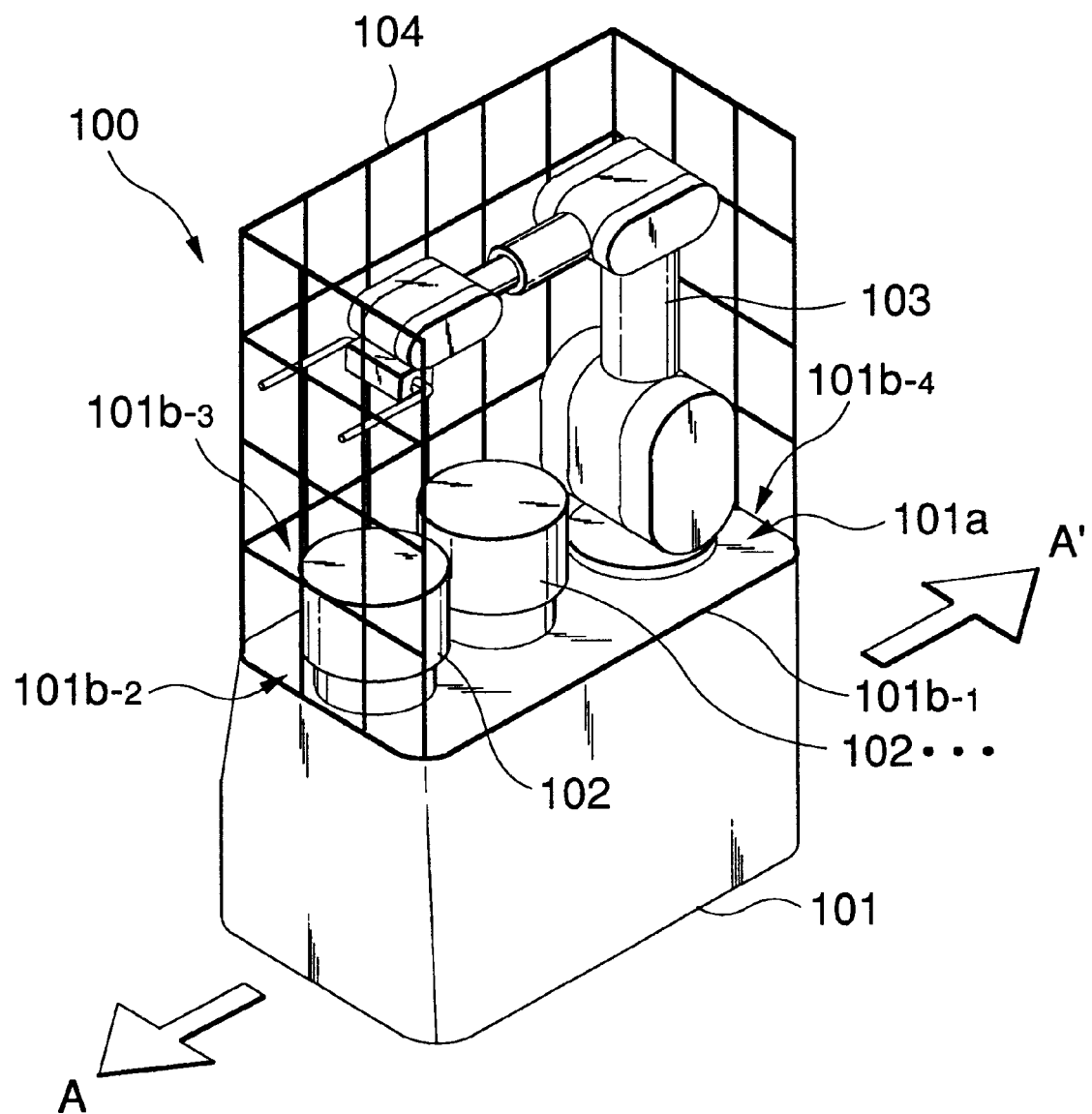
FIG. 6 is a perspective view showing an example of the structure of the conventional AGV 100.
Figure 7:
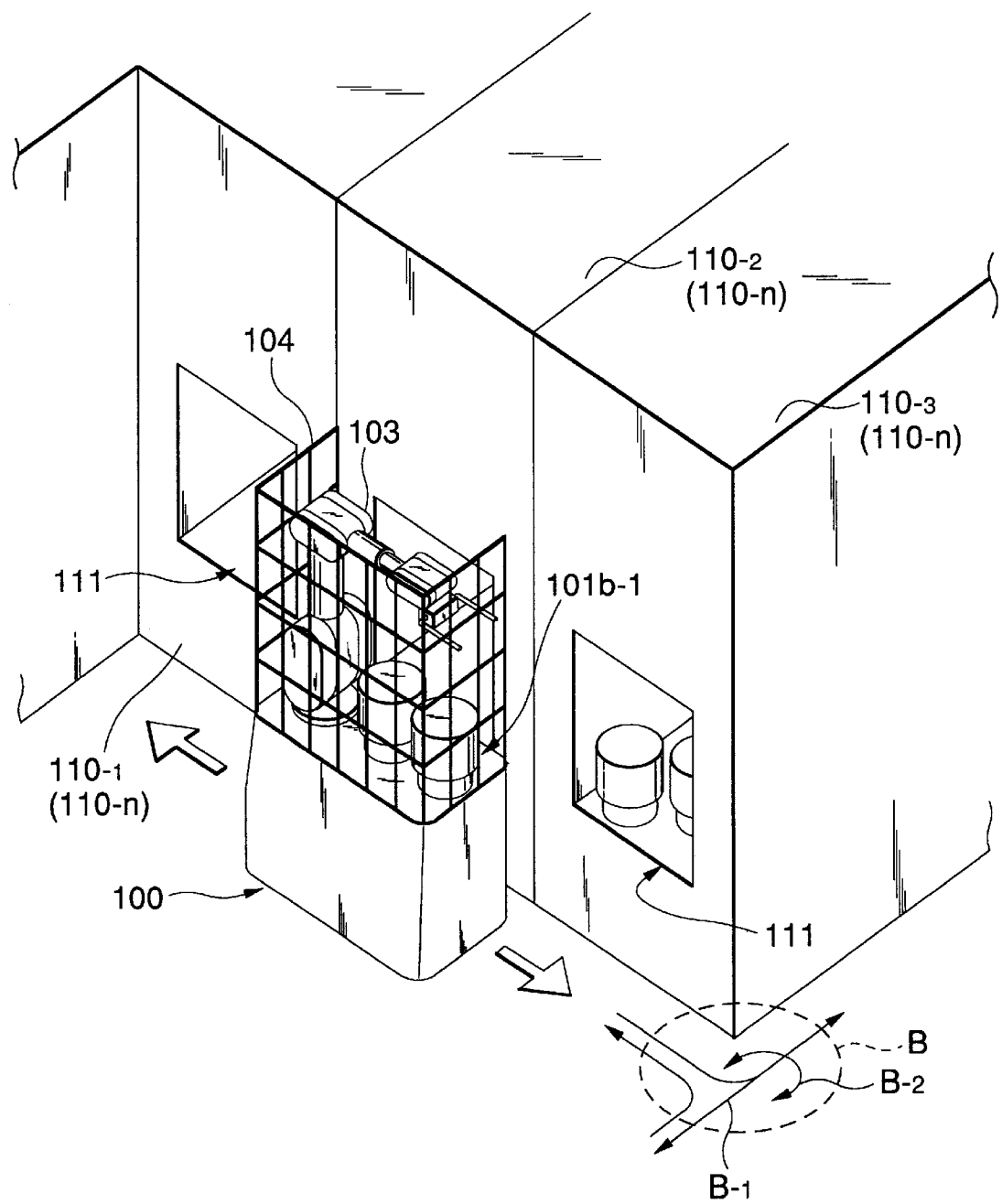
FIG. 7 is a perspective view showing the schematic structure of the clean room in which the AGVs 100 shown in FIG. 6 are disposed.

A first embodiment of the present invention will now be described with reference to FIGS. 1 and 2. The elements shown in FIG. 1 and corresponding to those shown in FIG. 6 or FIG. 7 are given the same reference numerals and the corresponding elements are omitted from description.

Figure 1:
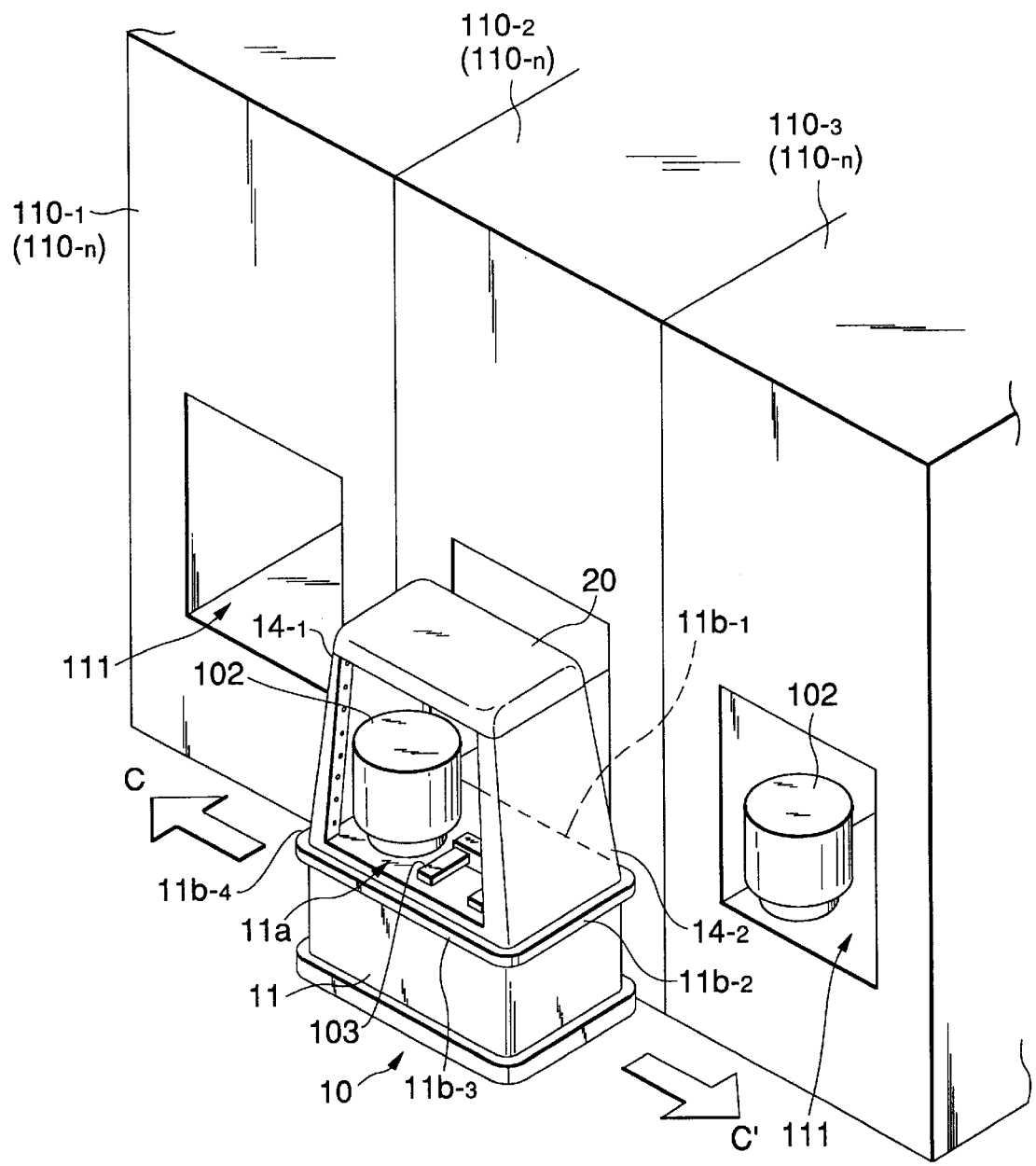
FIG. 1 is a perspective view showing the shape of an AGV 10 according to a first embodiment of the present invention and the schematic structure of the inside portion of a clean room in which the AGVs 10 are disposed.

Referring to FIG. 1, reference numeral 11 represents a vehicle portion of the AGV 10. The vehicle portion 11 has wheels rotated by a motor, a steering unit and a control unit for controlling parts of the AGV 10 including the foregoing parts. (Here, illustrations of the wheels rotated by the motor, the steering unit and the control unit is omitted.) The vehicle portion 11 is able to move in directions indicated with arrows C and C'. Although FIG. 1 shows the structure that the AGV 10 is moved in the direction C or C', the AGV 10 may be permitted to be moved in diagonal directions and lateral directions except other than the directions C and C'.

A plurality of wafer cassettes 102 can be mounted on the upper surface 11a of the vehicle portion 11. Moreover, a manipulator 103 having a horizontally articulated arm is mounted on the upper surface 11a.

Support members 14-1 and 14-2 are disposed on end portions 11b-4 and 11b-2 of the upper surface 11a of the vehicle portion 11 in the moving directions C and C'. Moreover, an upper unit 20 is disposed over the support members 14-1 and 14-2. On the other hand, portions on end portions 11b-1 and 11b-3 of the upper surface 11a perpendicular to the moving directions C and C' are opened.

For example, a filter such as a HEPA (High Efficiency Particulate Air-Filter), an ULPA (Ultra Low Penetration Air-Filter), etc., and a fan unit (not shown) are mounted on the upper unit 20.

Thus, air from which dust and the like have been removed is blown downwardly from the upper unit 20 so that cleanliness required for the wafer cassettes 102 having semiconductor wafers therein is maintained.

Figure 2:
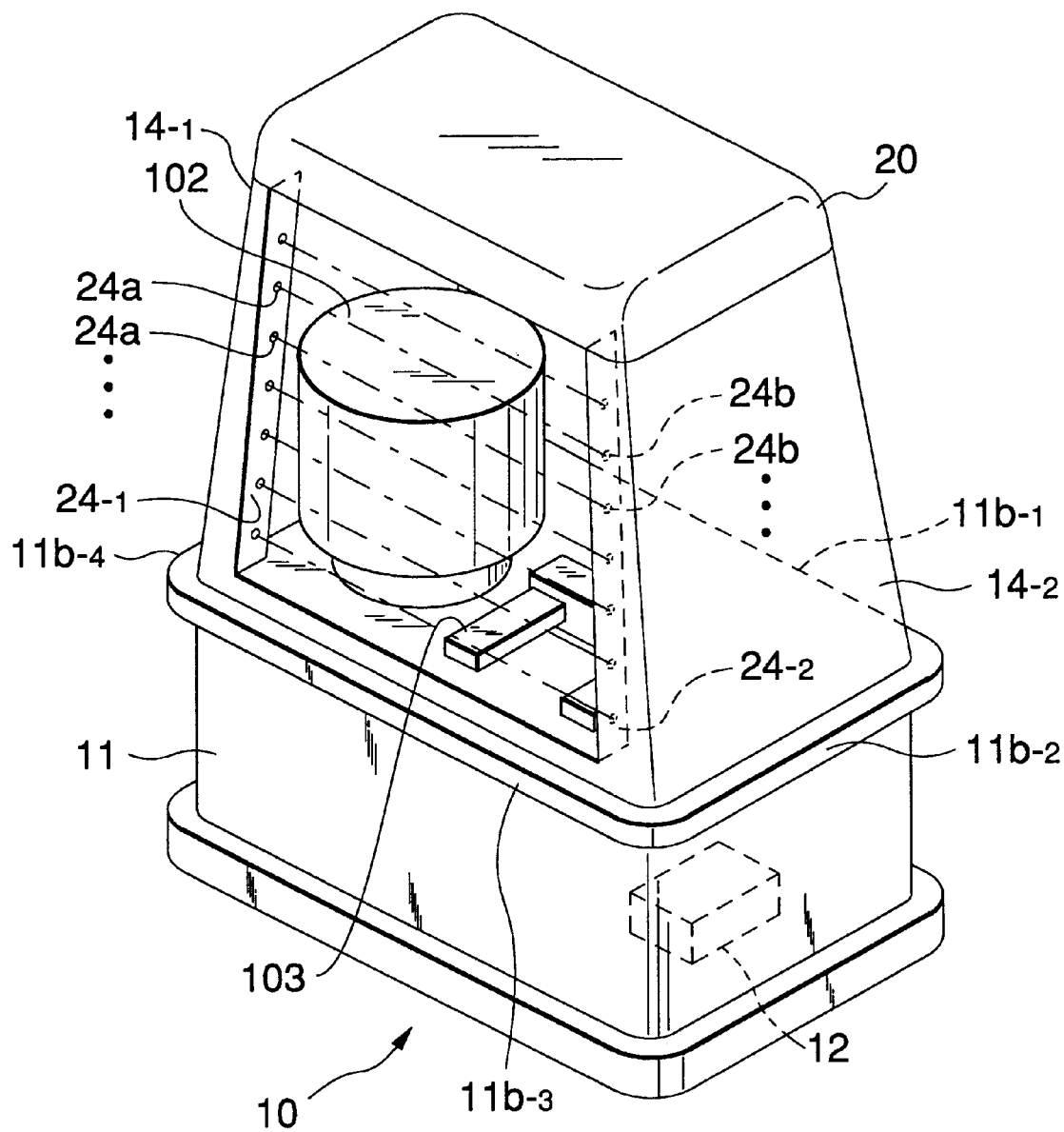
FIG. 2 is a perspective view showing the detailed structure of the AGV 10 according to the first embodiment.

In FIG. 2, reference numeral 12 represents a control unit included in the vehicle portion 11. The control unit 12 is arranged to store the movement passage for the AGV 10 and control the course of the AGV 10, the operation of the manipulator 103 and operation state/non-operative state of a light receiving portion (described later).

Reference numeral 24-1 represents a light emitting portion attached to the support member 14-1 adjacent to the end portion 11b-3. The light emitting portion 24-1 has a plurality of light emitting devices 24a arranged thereon. Reference numeral 24-2 represents a light receiving portion attached to the support member 14-2 adjacent to the end portion 11b-3. The light receiving portion 24-2 has a plurality of light receiving devices 24b arranged thereon.

Similarly, the light emitting portion 24-1 and the light receiving portion 24-2 are also respectively attached to the support members 14-1 and 14-2 adjacent to the end portion 11b-1. Therefore, they are omitted from illustration and description.

In a state shown in FIG. 1, the light receiving portion 24-2 adjacent to the end portion 11b-1 or the end portion 11b-3 opposite to a mounting portion 111 of each apparatus 110-n is brought into an operative state. On the other hand, the light receiving portion 24-2, adjacent to the end portion 11b-i or the end portion 11b-3 which is not opposite to the mounting portion 111, is brought into a non-operative state.

In the AGV 10 shown in FIG. 1, the light receiving portion 24-2 adjacent to the end portion 11b-1 and the light receiving portion 24-2 adjacent to the end portion 11b-3 are brought into the operative state when the AGV 10 is moved.

At this time, the control unit 12 monitors whether or not each of the light receiving devices 24b of the light receiving portion 24-2 is able to receive a beam emitted by each of the light emitting portion 24-1. If any one of the light receiving devices 24b cannot receive the beam, the control unit 12 stops the AGV 10.

When the AGV 10 transfers the wafer cassettes 102, the AGV 10 is stopped in front of the mounting portion 111 of a required apparatus 110-n, and then the light receiving portion 24-2 adjacent to the end portion 11b-1 or the end portion 11b-3 facing the mounting portion 111 is brought into the non-operative state.

Then, the manipulator 103 transfers the wafer cassettes 102 through the opening portion of end portion 11b-1 or the opening portion of end portion 11b-3 of the upper surface 11a of the vehicle portion 11.

At this time, the control unit 12 monitors whether or not each of the light receiving devices 24b of the light receiving portion 24-2 brought into the operative state is able to receive a beam emitted by each of the light emitting portion 24-1. If any one of the light receiving devices 24b cannot receive the beam, the control unit 12 interrupts the operation of the manipulator 103.

After the wafer cassettes 102 have been transferred, the light receiving portion 24-2 brought into the non-operative state is again brought into the operative state, and then the AGV 10 is moved to the front surface of the mounting portion 111 of a next apparatus 110-n.

As described above, the beams emitted from the light emitting portion 24-1 to the light receiving portion 24-2 brought into the operative state are obstructed if a worker or the like is intruded into the operation range for the manipulator 103 during the transferring operation of the manipulator 103 for the wafer cassettes 102. Similarly, the beams are obstructed if the manipulator 103 accidentally runs and intersects the beams during the transporting operation by the AGV. When such state is detected by the control unit 12, the control unit 12 interrupts the operation of the manipulator 103. Therefore, the contact between the worker or the like and the manipulator or the like can be prevented.

Although the light receiving portion 24-2 adjacent to the end portion 11b-1 and the light receiving portion 24-2 adjacent to the end portion 11b-3 are brought into the operative state during the movement of the AGV 10 as described above, they may be brought into the non-operative state during the movement of the AGV 10.

In addition, although the portions of the upper surface 11a of the vehicle portion 11, on which the wafer cassettes 102 can be mounted, have been described in the above embodiment, such portions of the upper surface 11a are not needed in the case of an AGV transporting only one wafer cassette while the wafer cassette held by a manipulator.

Second Embodiment

Figure 3:
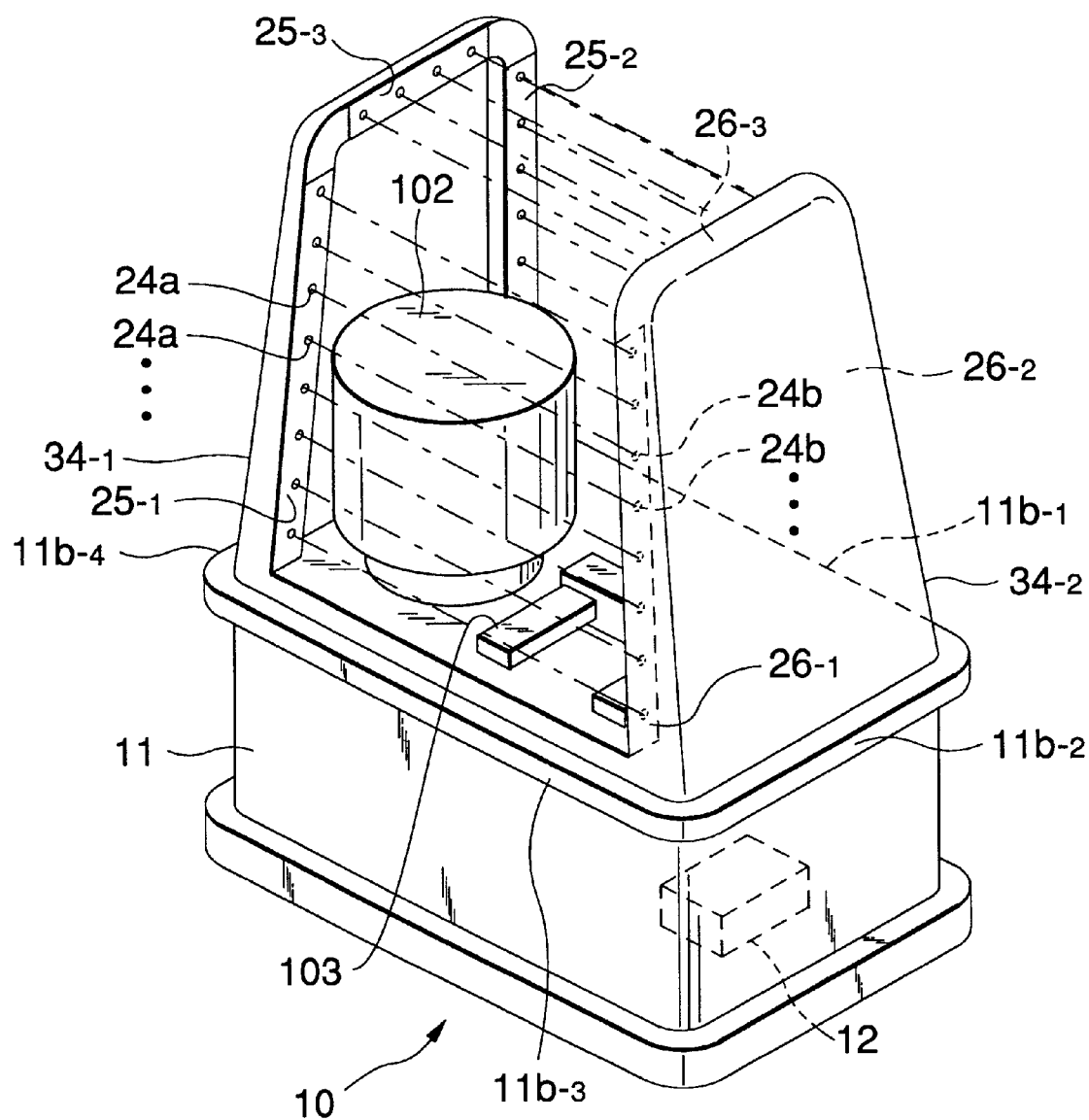
FIG. 3 is a perspective view showing a structure of the AGV according to a second embodiment of the present invention.

FIG. 3 is a perspective view showing a second embodiment of the AGV according to the present invention. Elements shown in FIG. 3 and corresponding to those shown in FIG. 1 or FIG. 2 are given the same reference numerals and the corresponding elements are omitted from description.

Referring to FIG. 3, reference numeral 34-1 and 34-2 represent side walls formed on the end portion 11b-4 or the end portion 11b-2 of each vehicle portion 11.

A light emitting portion 25-1 is attached to the side wall 34-1 adjacent to the end portion 11b-3, a light emitting portion 25-2 is attached to the side wall 34-1 adjacent to the end portion 11b-1, and a light emitting portion 25-3 is attached to a top end of the side wall 34-1. The light emitting portions 25-1, 25-2 and 25-3 each includes an array of a plurality of the light emitting devices 24a.

On the other hand, a light receiving portion 26-1 is attached to the side wall 34-2 adjacent to the end portion 11b-3, a light receiving portion 26-2 is attached to the side wall 34-2 adjacent to the end portion 11b-1 and a light receiving portion 26-3 is attached to a top end of the side wall 34-2. Each of the light receiving portions 26-1, 26-2 and 26-3 is formed by an array of a plurality of the light receiving devices 24b.

The opposite positional relationship is held on the vehicle portion 11 between the light emitting portion 25-1 and the light receiving portion 26-1, between the light emitting portion 25-2 and the light receiving portion 26-2 and between the light emitting portion 25-3 and the light receiving portion 26-3.

Similar to the first embodiment, the control unit 12 control so that the manipulator 103 performs the transferring operation through the opening portion of end portion 11b-1 or 11b-3 in which the light receiving portion is brought into the non-operative state. Furthermore, the control unit 12 monitors whether or not beams emitted by the light emitting portion corresponding to the light receiving portion brought into the operative state can be received.

When the control unit 12 detects the state that the light emitted by the light emitting portion has been obstructed, the control unit 12 interrupts the operation of the manipulator 103. Therefore, undesirable contact between a worker or the like and the manipulator or the like can be prevented.

Figure 4A:
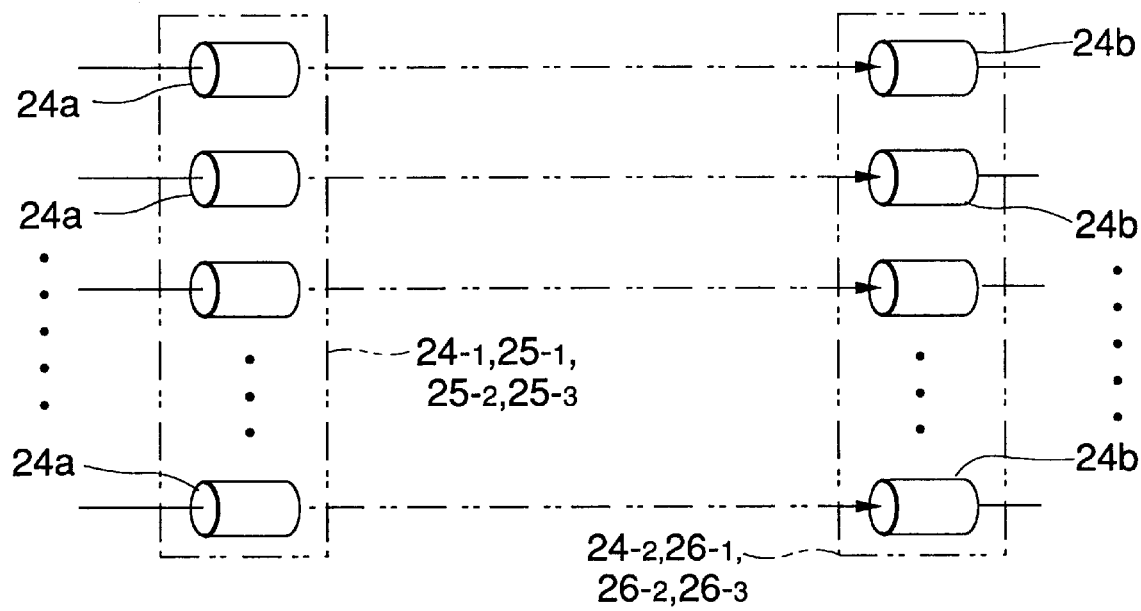
FIGS. 4a and 4b are schematic views showing the detailed configuration of light emitting devices 24a and light receiving devices 24b according to the second embodiment of the present invention.
Figure 4B:
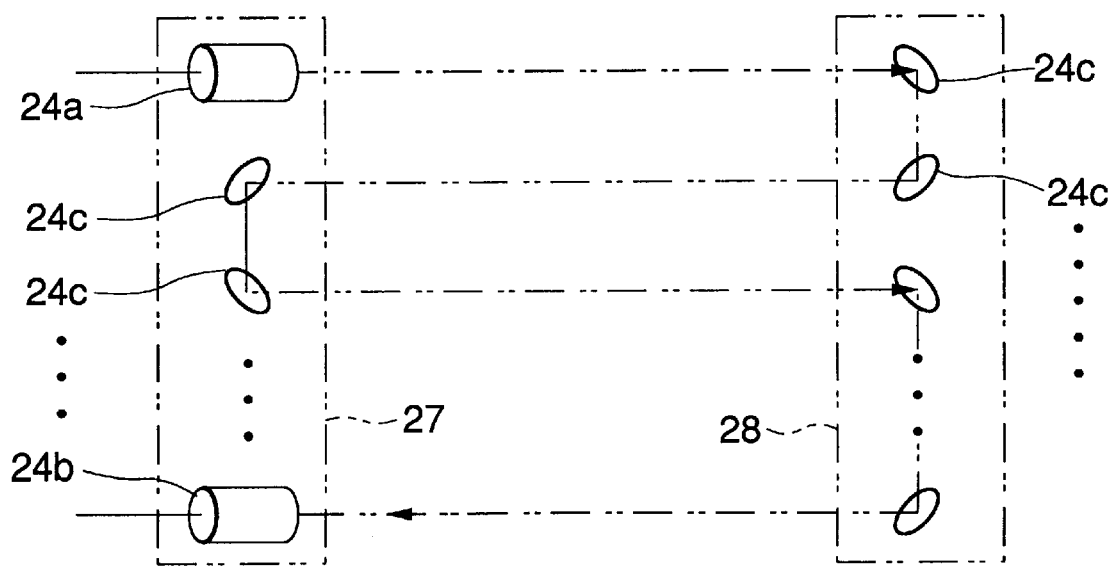

FIGS. 4a and 4b are schematic views showing the configuration of the light emitting devices 24a and light receiving devices 24b according to the first and second embodiments. FIG. 4a shows the same structure as that shown in FIGS. 1 to 3.

FIG. 4a shows the structure that each of the light emitting portions 24-1, 25-1, 25-2 and 25-3 includes an array of the light emitting devices 24a for emitting beams.

Each of the light receiving portions 24-2, 261, 26-2 and 26-3 includes an array of the light receiving devices 24b for receiving the beams emitted by the light emitting devices 24a. The light emitting portion 24-1, 25-1, 25-2 or 25-3 and corresponding light receiving portion 24-2, 26-1, 26-2 or 26-3 are disposed opposite to each other.

FIG. 4b is a schematic view showing another structure of the light emitting portion and the light receiving portion. In this example, the light emitting portion 24-1, 25-1, 25-2 or 25-3 may be replaced by a photosensor 27 as shown in FIG. 4b. Moreover, the light receiving portion 24-2, 26-1, 26-2 or 26-3 may be replaced by the reflecting portion 28.

The photosensor 27 includes the light emitting device 24a for emitting a beam, the light receiving device 24b for receiving the beam and a plurality of mirrors 24c for reflecting the beam.

The reflecting portion 28 includes an array of the plurality of the mirrors 24c.

A beam emitted by the light emitting device 24a is incident upon the opposite mirror 24c of the reflecting portion 28. Each of the mirrors 24c reflects the incident beam in such a manner that the optical axis of the beam is bent by 90° for example, as shown in FIG. 4b.

Accordingly, a beam emitted or reflected by the light emitting device 24a or the mirror 24c of the photosensor 27 is incident upon the mirror 24c of the reflecting portion 28, the beam is reflected by the mirror 24c and is incident upon the adjacent mirror 24c of the reflecting portion 28. Furthermore, this beam is reflected by the adjacent mirror 24c of the reflecting portion 28 and is incident upon the opposite mirror of the photosensor 27. An operation similar to the mirror 24c of the reflecting portion 28 is performed with the mirror 24c of the photosensor 27. This beam is finally incident upon the light receiving device 24b of the photosensor 27.

As a result of the foregoing structure, a beam emitted by the light emitting device 24a is reflected by the mirrors 24c, and then the beam is incident upon the light receiving device 24b. If an object which obstructs a beam exists between the opposite mirrors 24c of the photosensor 27 and the reflecting portion 28, the beam is not incident upon the light receiving device 24b.

That is, if one light emitting device 24a and one light receiving device 24b are provided, intrusion of a worker or the like into a space between the photosensor 27 and the reflecting portion 28, and the accidental run of the manipulator 103 during the transporting operation can reliably be detected. The control unit 12 detects such state, and controls to interrupt the operation of the manipulator 103.

Figure 5:
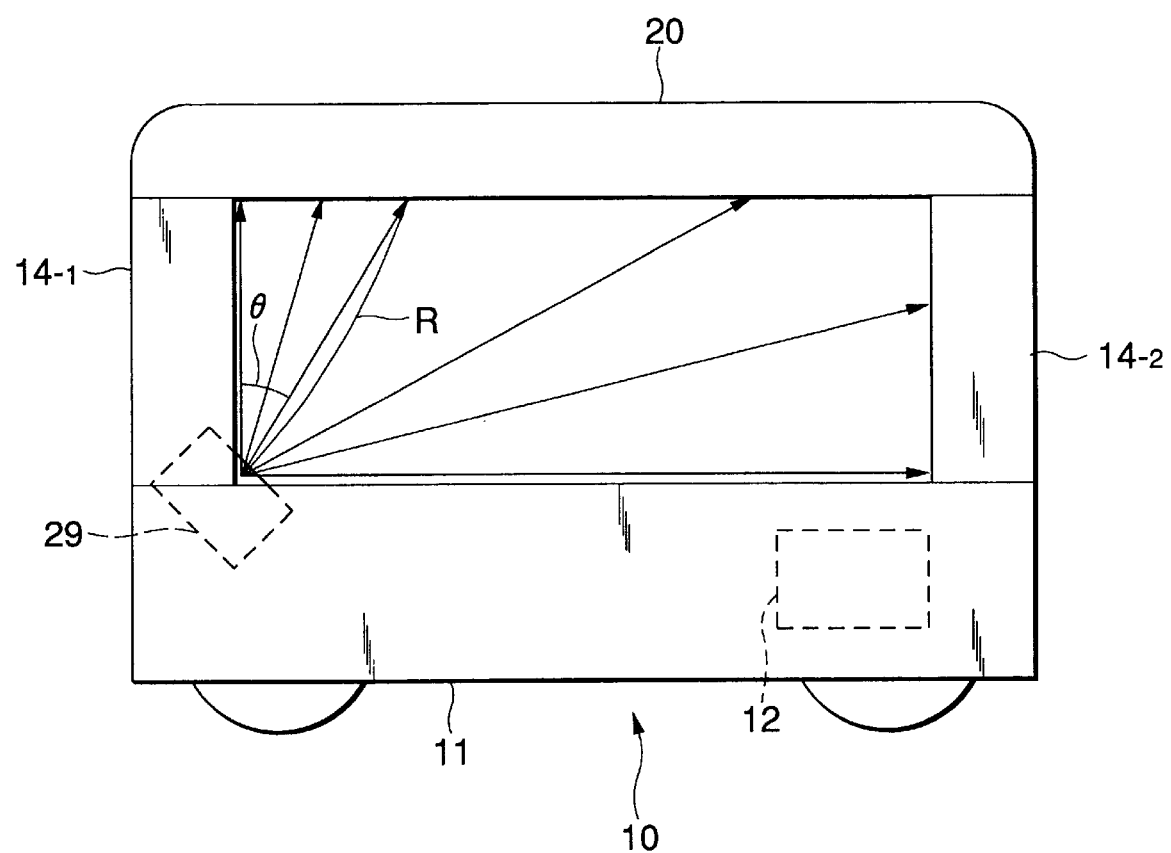

FIG. 5 is a side view showing another example of the sensor for detecting intrusion of a worker or the like. Referring to FIG. 5, reference numeral 29 represents a scanner for emitting a laser beam to detect reflection of light so as to measure the distance.

The structure shown in FIG. 5 is arranged in such a manner that a scanner 29 is attached to the lower left end of a monitoring region surrounded by a vehicle portion 11, support members 14-1 and 14-2 and an upper unit 20 so as to scan an annular region from $\theta=0°$ to $\theta=90°$.

Distance R is determined by the scanning angle $\theta$. When the measured distance is shorter than a predetermined direction R in a case where the scanning angle is certain angle $\theta$, the control unit 12 determines that a worker or the like is intruded into the monitoring region. Thus, the control unit 12 interrupts the operation of the manipulator.

The scanner 29 shown in FIG. 5 may employ a method of emitting a laser beam by using an oscillation mirror or a polygonal mirror.

Although the foregoing embodiment has the structure that the light receiving portions 24-2, 26-1, 26-2 or 26-3 of the portion for transferring the wafer cassettes are brought into the non-operative state, a result of detection performed by the light receiving portions 24-2, 26-1, 26-2 or 26-3 of the portion for transferring the wafer cassettes may be ignored by the control portion. As an alternative to this, the light receiving portion 24-2, 26-1, 26-2 or 26-3 may be brought into the non-operative state.

The above-mentioned embodiment has the structure that each of the light emitting portions 24-1, 25-1, 25-2 and 25-3, the light receiving portions 24-2, 26-1, 26-2 and 26-3 and the photosensor 27 or the reflecting portion 28 is formed only in one row. If the foregoing elements are formed into two or more rows, intrusion of a worker or the like and accidental run of a manipulator can furthermore reliably be monitored.

Third Embodiment

Figure 8:
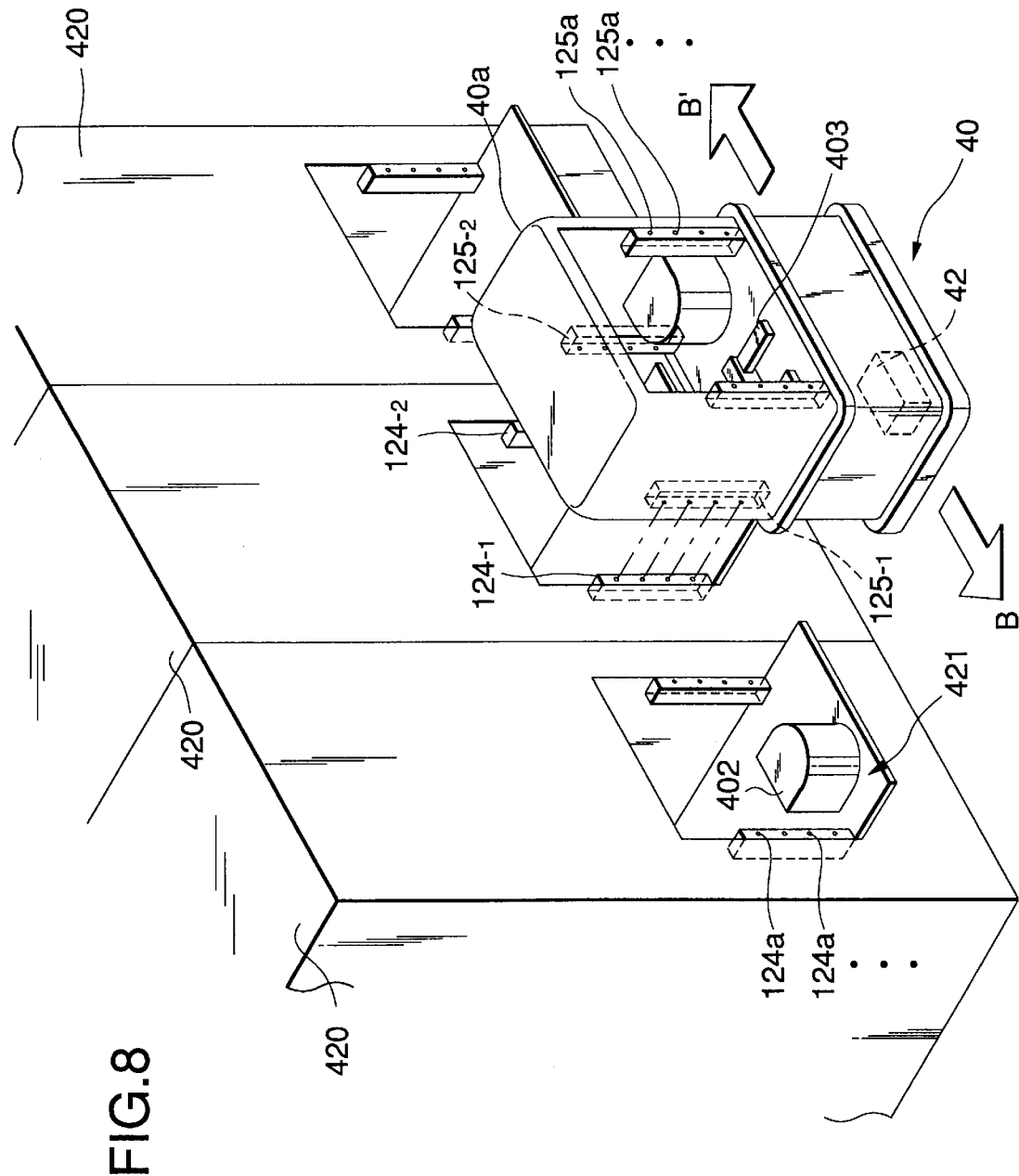
FIG. 8 is a perspective view showing the overall structure of an AGV in a clean room according to a third embodiment of the present invention.

FIG. 8 is a perspective view showing the overall structure of an AGV according to a third embodiment of the present invention.

Referring to FIG. 8, reference numeral 40 represents an AGV having a control unit 42 and a drive unit (not shown). Although the AGV 40 is able to move laterally, the AGV 40 is arranged to move in the directions indicated by arrows B and B'. The directions B and B' are forward and rearward directions in the description which will be made hereinafter.

A mounting portion 40a formed in the upper portion of the AGV 40 has opposite opening portions. Moreover, the mounting portion 40a includes an arm 403. The arm 403 is operated to transfer the wafer cassettes 402 between the opened portion and a load port 421 formed in the apparatus 420.

Protective fences (safety fences) or the like may be provided for the opening portions of the mounting portion 40a. Furthermore, a light emitting portion and a light receiving portion such as the first and second embodiments may be provided for the opening portion of the mounting portion 40a. In such the structure, intrusion of a worker or the like into the above-mentioned region during the movement of the AGV 40 or the operation of the arm 403 can be detected, and the movement of the AGV 40 and the operation of the arm 403 can be interrupted. In this embodiment, however, the foregoing elements are omitted from description and drawings.

The above-mentioned opening portion of the mounting portion 40a has light receiving portion 125-1 or 125-2.

Each of the light receiving portions 125-1 and 125-2 includes an array of a plurality of light receiving devices 125a.

On the other hand, the opening portion of the load port 421 of the apparatus 420 has light emitting portion 124-1 and 124-2 which are attached to the right-hand end and the left-hand end, respectively. Each of the light emitting portions 124-1 and 124-2 includes an array of a plurality of light emitting devices 124a.

When the AGV 40 is stopped in front of an arbitrary load port 421, the light emitting portion 124-1 and the light receiving 125-1 are positioned opposite to each other. Moreover, the light emitting portion 124-2 and the light receiving portion 125-2 are positioned opposite to each other.

Therefore, a beam emitted by each of the light emitting devices 124a is incident upon the opposite light receiving device 125a so that light curtains are formed between the load port 421 and the AGV 40.

Figure 9:
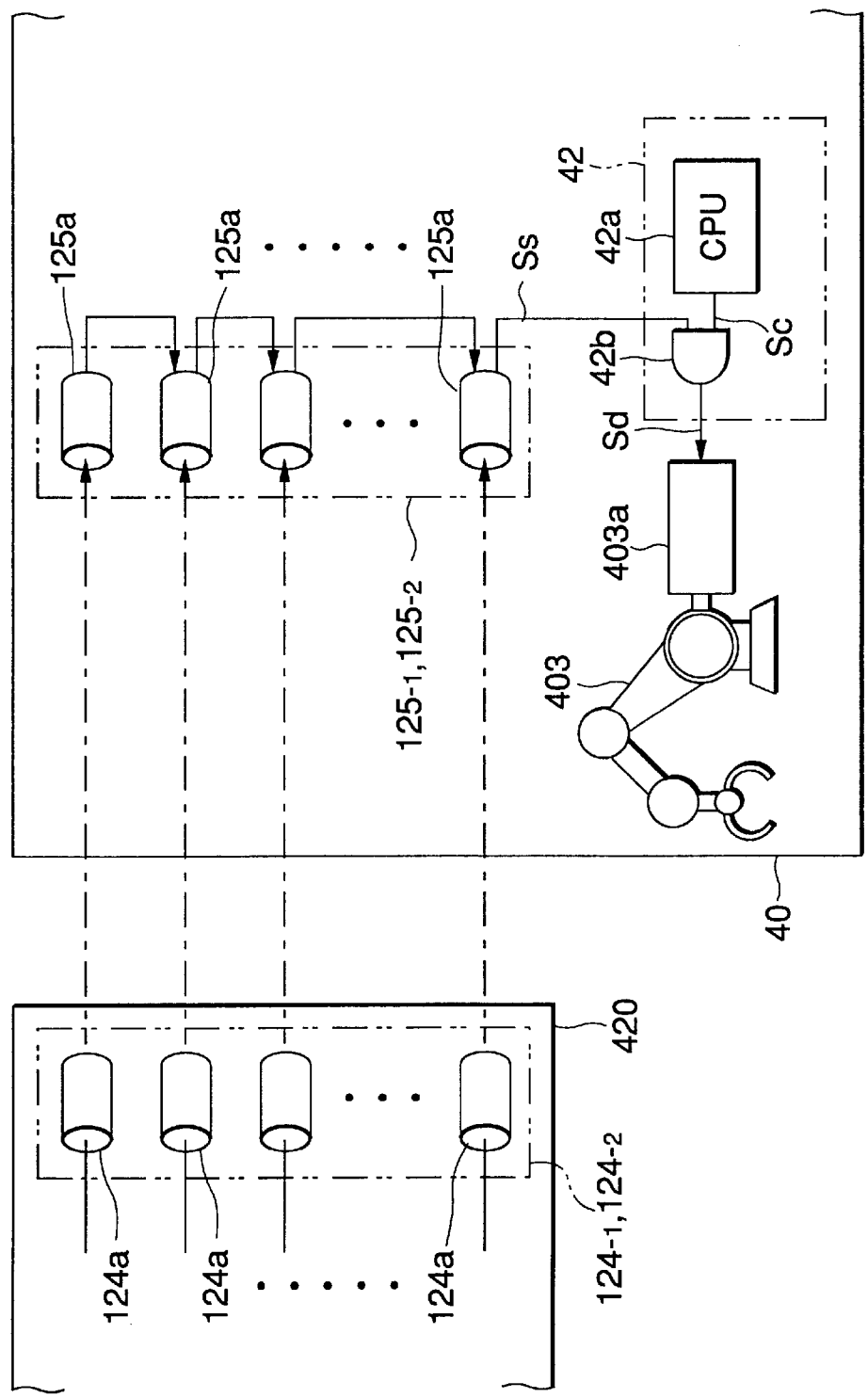
FIG. 9 is a block diagram showing the schematic structure of a control system according to the third embodiment.
Figure 10:
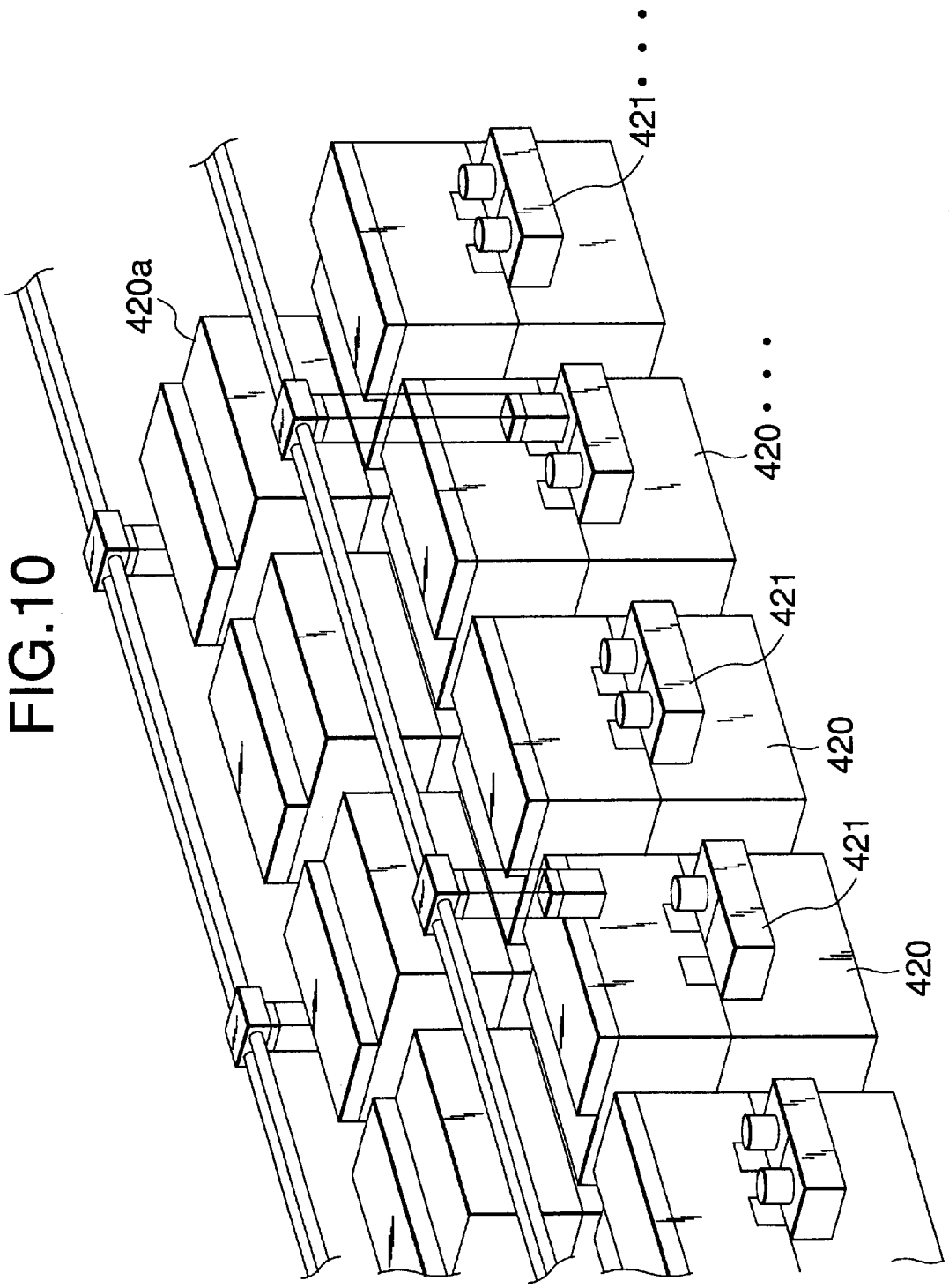
FIG. 10 is a perspective view showing the state of the conventional OHT-type clean room.
Figure 11:
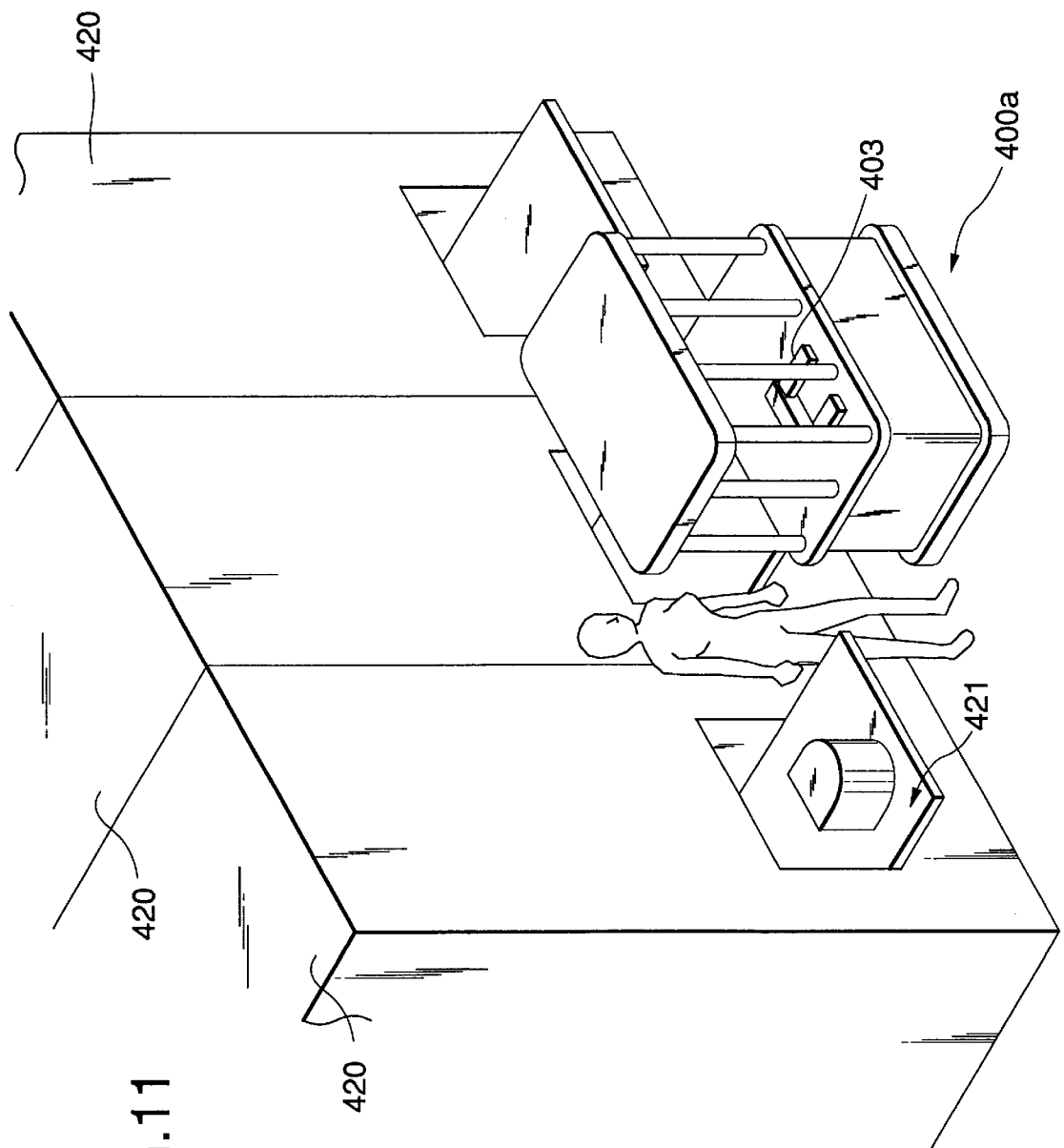

FIG. 9 is a block diagram showing the schematic structure of a control system according to this embodiment. As shown in FIG. 9, a control portion 42 of the AGV 40 has a CPU (Central Processing Unit) 42a and an AND (a logical product) circuit 42b.

The arm 403 has an operation portion 403a which operates movable portions of the joints or the like of the arm 403.

The light receiving portions 125-1 and 125-2 provided for the portion of the AGV 40 for transferring the wafer cassettes 402 or the like will now be described.

The light emitting devices 124a of the light emitting portions 124-1 and 124-2 respectively emit beams to the light receiving devices 125a of the light receiving portions 125-1 and 125-2.

On the other hand, the light receiving portion 125-1 or 125-2 transmits a detection signal Ss when all of the light receiving devices 125a receive beams emitted by the light emitting devices 124a.

The CPU 42a transmits a control signal Sc for operating the arm 403 when the AGV 40 has been stopped at a predetermined position in front of the load port 421. The control signal Sc and the detection signal Ss are input to the AND circuit 42b. An output of the AND circuit 42b is, as an operation signal Sd, supplied to the operation portion 403a.

As can be understood from the description about the structure, the AND circuit 42b calculates the logical product of the control signal Sc and the detection signal Ss. Only when both of the above-mentioned signals are supplied, the operation signal Sd is transmitted.

Therefore, the control signal Sc transmitted from the CPU 42a is not supplied to the operation portion 403a as the operation signal Sd in a state where the detection signal Ss is not transmitted. Therefore, the arm 403 is not operated.

If a worker or the like is, during the operation for transferring the wafer cassettes 402 or the like, intruded from a space between the apparatus 420 and the AGV 40 into the transferring region for the arm 403, any one of beams emitted by the light emitting devices 124a and being incident upon the light receiving devices 125a is obstructed.

Accordingly, transmission of the detection signal Ss is interrupted. Therefore, the operation signal Sd is not supplied to the operation portion 403a, causing the operation of the arm 403 to be interrupted. As a result, contact between the worker or the like and the arm 403 can be prevented.

The opening portion through which the transferring operation is not performed is closed by a protective fence or a light curtain. The light curtain has the same function as that of the light curtains formed in the space between the apparatus 420 and the AGV 40.

Therefore, a method in which the detection signal Ss created artificially is supplied or the like is employed to enable the arm 403 to be operated.

The above-mentioned embodiment has the structure that the light emitting portion is provided for the apparatus 420 and the light receiving portion is provided for the AGV 40. As an alternative to this, the light receiving portion may be provided for the apparatus 420 and the light emitting portion may be provided for the AGV 40.

In the foregoing case, a transmitter for transmitting a command signal for performing an operation by using the radio frequency is provided for the apparatus 420. On the other hand, a receiver for receiving the command signal for performing the operation is provided for the AGV 40. When the beam emitted from the AGV 40 is obstructed, transmission of the command signal for performing the operation is interrupted. As an alternative to this, a command signal for interrupting the operation may be transmitted to interrupt transmission of the control signal Sc from the CPU 42a.

In this embodiment, the light emitting portions are provided for the right and left ends of the load port 421 of the apparatus 420. Photosensors or the like may be provided at the top and bottom ends of the transferring region formed between the load port 421 and the AGV 40, that is, between the apparatus 420 and the AGV 40 to form a structure for monitoring intrusion of a worker or the like.

According to the present invention, even if a space is formed between the apparatus and the AGV, the transferring region between the apparatus and the AGV can be monitored by dint of the light curtain. Consequently, significant safety can be secured.

Figure 12:
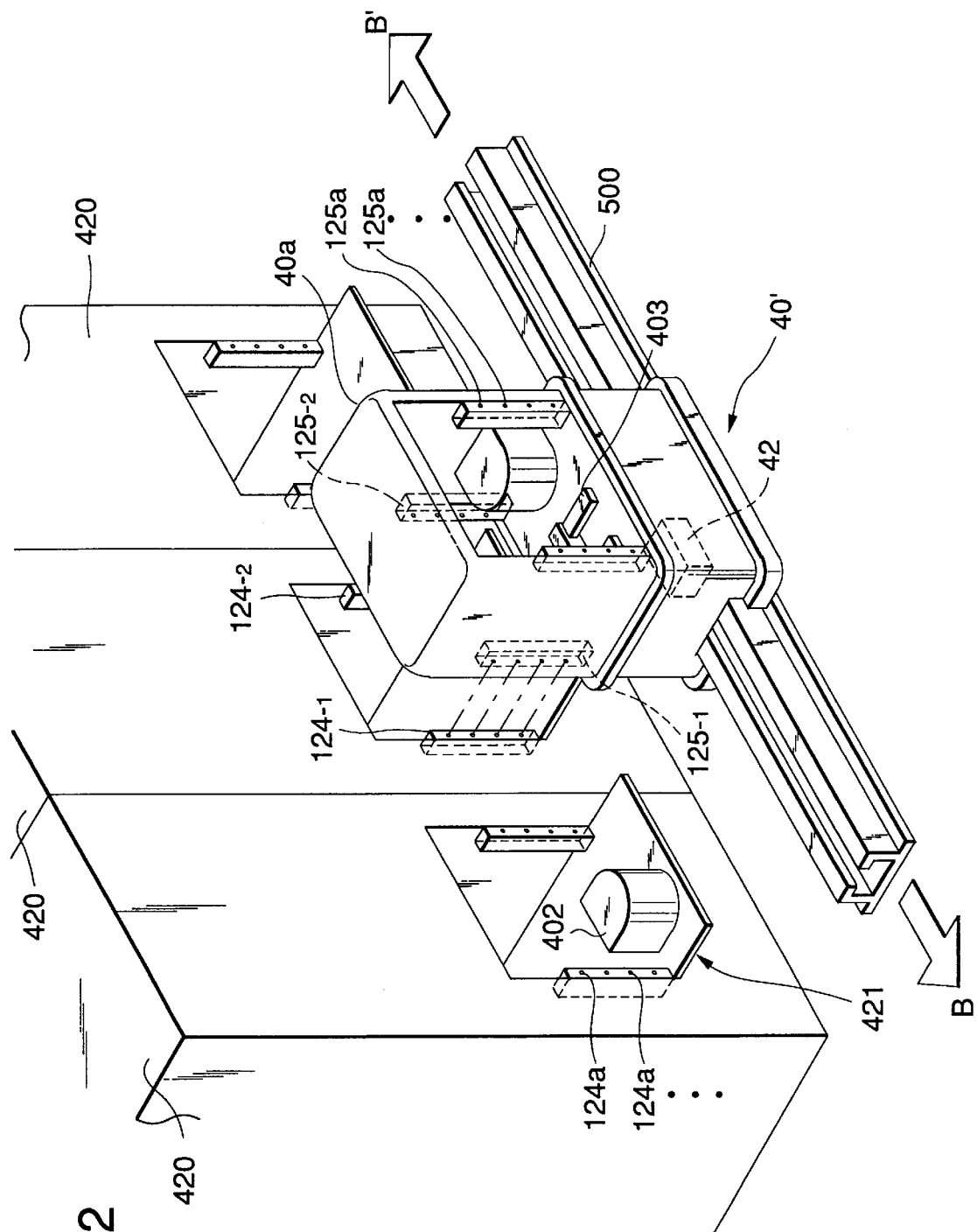
FIG. 12 is a perspective view showing a RGV in the clean room which is a modified example of the AGV in FIG. 8.

In the meantime, the present invention is not limited to the AGVs described in the above three embodiments. For example, the present invention may apply to a RGV (rail guided vehicle) instead of each of the AGVs. FIG. 12 is a perspective view showing a RGV 40' in the clean room which is a modified example of the AGV 40 in FIG. 8. As shown in FIG. 12, the RGV moves on a rail 500 which is provided in front of each of the load ports 421 of the apparatuses 420.

What is claimed is:

1. An automated guided vehicle, comprising:
   a transporting portion having an upper surface and a driving device, the transporting portion being movable by the driving device;
   a transferring device provided on the upper surface of the transporting portion, the transferring device being capable of transferring a workpiece to or from an apparatus;
   a mounting portion formed on the upper surface of the transporting portion, the mounting portion having at least two opening portions which allow an operation for transferring the workpiece;
   at least one photosensor respectively arranged on each of the opening portions to detect an object which intrudes from outside of the mounting portion into the mounting portion or projects from the mounting portion to the outside, each of the photosensors including a light emitting device emitting a beam and a light receiving device receiving the beam, the light emitting device and the light receiving device being respectively disposed on opposite end portions of each of the opening portions so as to oppose each other; and
   a control device which monitors a state of the photosensors and controls one of the transferring device and the driving device in accordance with the state of the photosensors;
   wherein when a beam emitted by the light emitting device of one of the opening portions and being incident upon the corresponding light receiving device is obstructed, the control device judges intrusion or projection of an object such that the control device controls the transferring device into a non-operative state when one of the photosensors, which is arranged on one of the opening portions other than the opening portion through which the transferring operation is performed, has detected intrusion or projection of an object via the obstruction of the beam.

2. The automated guided vehicle of claim 1, wherein the control device controls the photosensor arranged on the opening portion through which the transferring operation is performed into a non-operative state, and wherein when the other of the photosensors in an operative state detects intrusion or projection of an object, the control device controls the transferring device into an non-operative state.

3. The automated guided vehicle of claim 1, wherein the photosensors each include a plurality of light emitting devices emitting beams and a plurality of light receiving devices receiving the beams, the light emitting devices and the light receiving devices being respectively disposed on opposite end portions of each of the opening portions so as to oppose each other, and wherein
   when a beam emitted by one of the light emitting devices and being incident upon the corresponding one of the light receiving devices is obstructed, intrusion or projection of an object is detected.

4. The automated guided vehicle of claim 1, wherein the photosensors each include a sensor portion having a light emitting device emitting a beam and a light receiving device receiving the beam, and a reflecting portion reflecting the beam emitted by the light emitting device so that the beam is incident upon the light receiving device, the sensor portion and the reflecting portion being respectively disposed on opposite end portions of each of the opening portions, and wherein the control device judges intrusion of projection of an object when a beam emitted by the light emitting device and reflected by the reflecting portion is obstructed.

5. The automated guided vehicle of claim 4, wherein the reflecting portion has reflecting devices, and wherein the beam emitted by the light emitting device is reflected between the reflecting devices and is incident upon the light receiving device.

6. The automated guided vehicle of claim 5, wherein the sensor portion has a reflecting device, and wherein the beam emitted by the light emitting device is repeatedly reflected between the sensor portion and the reflecting portion and is incident upon the light receiving device.

7. An automated guided vehicle, comprising:
   a transporting portion having an upper surface and a driving device, the transporting portion being movable by the driving device;

a transferring device provided on the upper surface of the transporting portion, the transferring device being capable of transferring a workpiece to or from an apparatus;

a mounting portion formed on the upper surface of the transporting portion, the mounting portion having at least two opening portions which allow an operation for transferring the workpiece;

at least one photosensor attached to a position in an opening plane of one of the opening portions, the at least one photosensor including a light scanning device emitting a beam and scanning the opening plane with the beam; and a control device which monitors a state of the photosensor and controls one of the transferring device and the driving device in accordance with the state of the photosensor, wherein the control device detects intrusion of an object when a distance of propagation of the beam emitted from the photosensor at a certain scanning angle, reflected in the opening plane and incident upon the light scanning device, becomes shorter than a distance which is previously determined to correspond to that scanning angle.

8. An automated guided vehicle, comprising:

a transporting portion having an upper surface and a driving device, the transporting portion being movable by the driving device;

a transferring device provided on the upper surface of the transporting portion, the transferring device being capable of transferring a workpiece to or from an opening portion of an apparatus;

a mounting portion formed on the upper surface of the transporting portion, the mounting portion having at least two opening portions which allow an operation for transferring the workpiece;

a light emitting portion emitting a beam, the light emitting portion being provided on one of the opening portion of the apparatus and each of the opening portions of the mounting portion; and a light receiving portion receiving the beam, the light receiving portion being provided on the other of the opening portion of the apparatus and each of the opening portions of the mounting portion, wherein an operation of the transferring device is interrupted when the beam is obstructed.

9. The automated guided vehicle of claim 8, wherein the light emitting portion is provided on an end portion of the opening portion of the apparatus, and the light receiving portion is provided on an end portion of each of the opening portions of the mounting portion, so that a light curtain is formed between the opening portion of the apparatus and one of the opening portions.

10. The automated guided vehicle of claim 8, wherein the light receiving portion is provided on an end portion of the opening portion of the apparatus, and the light emitting portion is provided on an end portion of each of the opening portions of the mounting portion, so that a light curtain is formed between the opening portion of the apparatus and one of the opening portions.

11. A rail guided vehicle, comprising:

a transporting portion including a driving device and a portion contacting with a rail, the transporting portion being movable along the rail by the driving device, and the transporting portion having an upper surface;

a transferring device provided on the upper surface of the transporting portion, the transferring device being capable of transferring a workpiece to or from an opening portion of an apparatus;

a mounting portion formed on the upper surface of the transporting portion, the mounting portion having at least two opening portions which allow an operation for transferring the workpiece;

a light emitting portion emitting a beam, the light emitting portion being provided on one of the opening portion of the apparatus and each of the opening portions of the mounting portion; and a light receiving portion receiving the beam, the light receiving portion being provided on the other of the opening portion of the apparatus and each of the opening portions of the mounting portion, wherein an operation of the transferring device is interrupted when the beam is obstructed.

12. The rail guided vehicle of claim 11, wherein the light emitting portion is provided on an end portion of the opening portion of the apparatus, and the light receiving portion is provided on an end portion of each of the opening portions of the mounting portion, so that a light curtain is formed between the opening portion of the apparatus and one of the opening portions.

13. The rail guided vehicle of claim 11, wherein the light receiving portion is provided on an end portion of the opening portion of the apparatus, and the light emitting portion is provided on an end portion of each of the opening portions of the mounting portion, so that a light curtain is formed between the opening portion of the apparatus and one of the opening portions.

* * * * *